(12) United States Patent
Zhong et al.

(10) Patent No.: US 11,107,744 B2
(45) Date of Patent: Aug. 31, 2021

(54) INSULATED GATE BIPOLAR TRANSISTOR MODULE AND MANUFACTURING METHOD THEREOF

(71) Applicant: RAYBEN TECHNOLOGIES (ZHUHAI) LIMITED, Zhuhai (CN)

(72) Inventors: Shan Zhong, Zhuhai (CN); Weidong Gao, Zhuhai (CN); Qizhao Hu, Zhuhai (CN); Wai Kin Raymond Lam, Zhuhai (CN)

(73) Assignee: RAYBEN TECHNOLOGIES (ZHUHAI) LIMITED, Zhuhai (CN)

( * ) Notice: Subject to any disclaimer, the term of this patent is extended or adjusted under 35 U.S.C. 154(b) by 66 days.

(21) Appl. No.: 16/476,107

(22) PCT Filed: Jan. 22, 2017

(86) PCT No.: PCT/CN2017/072072
§ 371 (c)(1),
(2) Date: Jul. 5, 2019

(87) PCT Pub. No.: WO2018/133069
PCT Pub. Date: Jul. 26, 2018

(65) Prior Publication Data
US 2019/0355644 A1  Nov. 21, 2019

(51) Int. Cl.
*H01L 23/367* (2006.01)
*H01L 21/48* (2006.01)
(Continued)

(52) U.S. Cl.
CPC ........ *H01L 23/367* (2013.01); *H01L 21/4871* (2013.01); *H01L 21/50* (2013.01);
(Continued)

(58) Field of Classification Search
CPC ............ H01L 21/4871; H01L 21/4875; H01L 21/4882; H01L 21/50; H01L 29/7393;
(Continued)

(56) References Cited

U.S. PATENT DOCUMENTS 7,547,966 B2   6/2009   Funakoshi et al.
7,732,917 B2   6/2010   Saito et al.
(Continued)

FOREIGN PATENT DOCUMENTS

CN    102254886 A    11/2011
CN    104867891 A    8/2015
(Continued)

*Primary Examiner* — Kenneth Parker
*Assistant Examiner* — John Lin
(74) *Attorney, Agent, or Firm* — Bayramoglu Law Offices LLC (57) ABSTRACT

An IGBT module includes a heat dissipation base plate. A first ceramic heat dissipation element is embedded in the heat dissipation base plate. A first wiring layer is provided on the surface of the heat dissipation base plate. The first side of an IGBT chip is mounted onto the first wiring layer. The second side of the IGBT chip is provided with a heat conductive metal plate. A first heat dissipation plate having a first through hole is provided on a side of the first wiring layer. The IGBT chip and the heat conductive metal plate are
(Continued)

located in the first through hole. A second wiring layer is provided on a side of the first heat dissipation plate away from the IGBT chip. The second wiring layer is provided on a side of the heat conductive metal plate.

18 Claims, 3 Drawing Sheets

(51) Int. Cl.
    *H01L 23/373*     (2006.01)
    *H01L 21/50*     (2006.01)
    *H01L 29/739*     (2006.01)

(52) U.S. Cl.
    CPC ...... *H01L 23/3731* (2013.01); *H01L 23/3733* (2013.01); *H01L 29/7393* (2013.01)

(58) Field of Classification Search
    CPC ............... H01L 29/7395; H01L 25/072; H01L 2023/405; H01L 2023/4037; H01L 23/367; H01L 23/3677; H01L 23/373; H01L 23/3731; H01L 23/3733; H01L 23/3735; H01L 23/3736; H01L 23/3737; H01L 23/49838; H01L 23/5385; H05K 1/0203; H05K 1/0204; H05K 1/0207; H05K 1/021; H05K 1/0212; H05K 1/0306

See application file for complete search history.

(56) References Cited

U.S. PATENT DOCUMENTS

| | | | | |
|---|---|---|---|---|
| 2003/0058630 | A1* | 3/2003 | Takano | ................ H05K 1/0206 361/783 |
| 2006/0284304 | A1* | 12/2006 | Caletka | ............... H01L 23/3128 257/700 |
| 2008/0054425 | A1* | 3/2008 | Malhan | ................... H01L 24/01 257/678 |
| 2009/0294947 | A1* | 12/2009 | Tain | .................... H01L 25/0657 257/686 |
| 2014/0144677 | A1* | 5/2014 | Wang | ................... H05K 1/0206 174/252 |
| 2015/0357309 | A1* | 12/2015 | Liu | ........................ H01L 25/50 257/692 |
| 2018/0122777 | A1* | 5/2018 | Wong | ..................... H01L 29/20 |

FOREIGN PATENT DOCUMENTS

| | | |
|---|---|---|
| CN | 105590930 A | 5/2016 |
| CN | 106098648 A | 11/2016 |

\* cited by examiner

INSULATED GATE BIPOLAR TRANSISTOR MODULE AND MANUFACTURING METHOD THEREOF

CROSS REFERENCE TO THE RELATED APPLICATIONS

This application is the national phase entry of International Application No. PCT/CN2017/072072, filed on Jan. 22, 2017, the entire contents of which are incorporated herein by reference.

TECHNICAL FIELD

The present invention relates to the field of semiconductor devices, and in particular to a method for manufacturing an Insulated Gate Bipolar Transistor (IGBT) heat dissipation plate with a good heat dissipation performance and an IGBT module.

BACKGROUND

IGBT is a fully-controlled voltage-driven power semiconductor device, which is hybrid of Bipolar Junction Transistor (BJT) and Insulated Gate Field Effect Transistor (IGFET). As a commonly used electronic device, IGBT is widely applied in various electronic devices. As the high-current electronic apparatuses such as the frequency converter continue to evolve, stricter requirements are required for the performances of IGBT chips. For instance, the IGBT chip is required to carry higher current. However, the increase of current carrying capability of the IGBT chips is always accompanied by the increase of heat generation. Failure to timely dissipate the heat generated by the IGBT chip has a strong impact on the operation of the IGBT chip and can even affect the operation of other electronic devices on the circuit board. Hence, the IGBT module with high heat dissipation capability is commonly required in the industry.

The existing IGBT chip is usually packaged on a circuit board. Generally, the heat dissipation plate is provided on one side of the circuit board. In order to realize the insulation of the heat dissipation plate, a ceramic sheet is usually provided on one side of the heat dissipation plate. A part of pins of the IGBT chip, such as the gate terminal and the emitter terminal, are usually packaged on the ceramic sheet by a surface mounted technology. The collector terminal is often connected to the circuit in the circuit board through a metal wire. Since the metal wire with small cross-sectional diameter has poor electrical conductivity, the metal wire is unable to carry large current, thereby limiting the current-carrying capability of the IGBT module.

Besides, in the existing IGBT module, since the IGBT chip is directly mounted onto the ceramic sheet, the heat dissipation performance of the IGBT module is not satisfactory, and the maximum voltage and maximum current of the IGBT module are also limited. As a result, the voltage withstanding capacity and the heat dissipation performance of the IGBT module cannot satisfy the requirements of the electronic apparatuses.

SUMMARY

Technical Problem

The first objective of the present invention is to provide an IGBT module with a good heat dissipation performance and a high current-carrying capability.

The second objective of the present invention is to provide a method for manufacturing the above-mentioned IGBT module.

Solution to Solve the Problems

Technical Solution

In order to achieve the first objective, the present invention provides an IGBT module which includes a heat dissipation base plate, wherein a first ceramic heat dissipation element is embedded in the heat dissipation base plate; a first wiring layer is provided on a surface of the heat dissipation base plate; a first side of an IGBT chip is mounted onto the first wiring layer; a second side of the IGBT chip is provided with a heat conductive metal plate; a first heat dissipation plate having a first through hole is provided on a side of the first wiring layer; the IGBT chip and the heat conductive metal plate are located in the first through hole; a second wiring layer is provided on a side of the first heat dissipation plate away from the IGBT chip, and the second wiring layer is provided on a side of the heat conductive metal plate; a second ceramic heat dissipation element and a second heat dissipation plate having a second through hole are provided on a side of the second wiring layer away from the IGBT chip; the second ceramic heat dissipation element is located in the second through hole; a third wiring layer is provided on the second heat dissipation plate; an organic insulating medium is filled between the first heat dissipation plate and the heat dissipation base plate, and the organic insulating medium is also filled between the first heat dissipation plate and the second heat dissipation plate.

Preferably, an IC chip having a heat dissipation sheet is further provided at a side of the first wiring layer; the IC chip and the heat dissipation sheet are located in the second through hole; and each second through hole is provided with one IGBT chip or one IC chip.

Further, the heat conductive metal plate is provided on a collector terminal of the IGBT chip, and a gate terminal and an emitter terminal of the IGBT chip are mounted onto the first wiring layer.

Further, the first heat dissipation plate and/or the second heat dissipation plate each include a fiberglass plate, and first metal layers are provided on two sides of the fiberglass plate.

Further, the first ceramic heat dissipation element and/or the second ceramic heat dissipation element each include a ceramic element, and second metal layers are provided on two sides of the ceramic element.

Further, a thickness of the heat conductive metal plate is greater than a thickness of the second wiring layer, and the organic insulating medium is polypropylene, epoxy resin, or silane.

In order to achieve the second objective, the present invention provides a method for manufacturing an IGBT module which includes: manufacturing a heat dissipation base plate, embedding a first ceramic heat dissipation element in the heat dissipation base plate, and forming a first wiring layer on a surface of the heat dissipation base plate; mounting an IGBT chip onto a heat conductive metal plate, and mounting the IGBT chip with the heat conductive metal plate onto the first wiring layer, wherein two opposite surfaces of the IGBT chip are respectively mounted onto the heat conductive metal plate and the first wiring layer; placing a first prepreg and a first heat dissipation plate having a first through hole on the first wiring layer, wherein the IGBT chip and the heat conductive metal plate are located in the first through hole; laminating the first heat dissipation plate and the first prepreg with the heat dissipation base plate, electroplating a first metal layer onto the first heat dissipation plate and the heat conductive metal plate, etching the first metal layer to form a second wiring layer, thereby forming an intermediate product; then, mounting a second ceramic heat dissipation element onto the second wiring layer, and placing a second prepreg and a second heat dissipation plate having a second through hole on the second wiring layer, wherein the second ceramic heat dissipation element is located in the second through hole; laminating the intermediate product and the second prepreg with the second ceramic heat dissipation element, and electroplating a second metal layer onto the second heat dissipation plate and the second ceramic heat dissipation element; and etching the second metal layer to form a third wiring layer.

Preferably, an IC chip is mounted on the heat dissipation sheet before the first prepreg is placed on the first wiring layer. The IC chip is located in the first through hole after the first prepreg and the first heat dissipation plate with the first through hole are placed on the first wiring layer.

Further, the step of mounting the IGBT chip onto the heat conductive metal plate includes: mounting two or more IGBT chips on one heat conductive metal plate, and cutting the heat conductive metal plate to obtain cut heat conductive metal plates each with one IGBT module.

Further, in the step of mounting the IGBT chip onto the heat conductive metal plate, the collector terminal of the IGBT chip is mounted onto the heat conductive metal plate; and in the step of mounting the IGBT chip onto the first wiring layer, the gate terminal and the emitter terminal of the IGBT chip are mounted onto the first wiring layer.

Further, a laminated board obtained by laminating the first heat dissipation plate and the first prepreg with the heat dissipation base plate is polished, and a first metal layer is electroplated onto the first heat dissipation plate and the heat conductive metal plate.

Further, a laminated plate obtained by laminating the intermediate product and the second prepreg with the second ceramic heat dissipation element is polished, and a second metal layer is electroplated onto the second heat dissipation element and the second ceramic heat dissipation element.

Advantageous Effects

In the IGBT module provided by the present invention, one surface of the IGBT chip is mounted onto the first wiring layer, and the other surface of the IGBT chip is mounted onto the heat conductive metal plate. Moreover, the second wiring layer is formed on the heat conductive metal plate. With such an arrangement, the pins of the IGBT chip can be connected to the wiring layer without the assist of the metal wires. The heat conductive metal plate has a current carrying capability higher than that of the metal wires, so this design can greatly upgrade the current carrying capability of the IGBT module.

Moreover, since the IGBT chip is embedded between the heat dissipation base plate and the first heat dissipation plate, and since the organic insulating medium is filled between the heat dissipation base plate and the first heat dissipation plate, the periphery of the IGBT chip is surrounded by the organic insulating medium. Since the organic insulating medium has a high voltage withstanding capability, the IGBT module can withstand up to 40 KV high voltage, so the voltage withstanding capability of the IGBT module is greatly improved.

Moreover, one surface of the IGBT chip is connected to the heat dissipation base plate through the first wiring layer, and the other surface of the IGBT chip is directly mounted onto the heat conductive metal plate, so the heat generated by the IGBT chip can be timely dissipated through the heat dissipation base plate and the heat conductive metal plate. Therefore, the accumulation of a large amount of heat on the IGBT chip is avoided, and the heat dissipation performance of the IGBT module is improved.

Moreover, the collector terminal of the IGBT chip is mounted onto the heat conductive metal plate, and the gate terminal and the emitter terminal are mounted onto the first wiring layer. In the mounting process, the gate terminal and the emitter terminal are relatively easier to position, so with this design, the difficulty in mounting the IGBT chip on the first wiring layer can be reduced and the difficulty in manufacturing the IGBT module can be lowered. In addition, since large current flows through the collector terminal, the thickness of the metal layer of the second wiring layer in the present invention can be increased so as to increase the current flowing through the IGBT chip, thereby improving the electrical conductivity of the IGBT module.

Moreover, the IGBT module may be further provided with the IC chip, and the IC chip may be provided in the first through hole of the first heat dissipation plate so that the IGBT module including the IC chip can be designed according to the production requirements for the different types of IGBT modules.

Moreover, since the laminated plate obtained by laminating the first heat dissipation plate and the first prepreg with the heat dissipation base plate is polished, the organic insulating medium overflowed to the plate surface when pressing the first prepreg can be removed by polishing so as to be free of the impacts of the organic insulating medium left on the plate surface in the subsequent processes. Further, the heat conductive metal plate is designed to have a larger thickness, for example greater than or equal to 0.6 mm, so the impacts on the heat dissipation performance of the IGBT chip caused by over polishing of the heat conductive metal plate can be avoided.

The present invention will be further described below in conjunction with the drawings and embodiments.

DETAILED DESCRIPTION OF THE EMBODIMENTS

Embodiment 1

In the present invention, the IGBT module is provided with a heat dissipation base plate, and the IGBT chip is mounted onto the heat dissipation base plate. The IGBT module is further provided with two heat dissipation plates, and the IGBT chip is embedded between the heat dissipation base plate and one heat dissipation plate. The organic insulating medium is filled around the IGBT module chip to improve the insulation performance of the IGBT chip.

Figure 1:
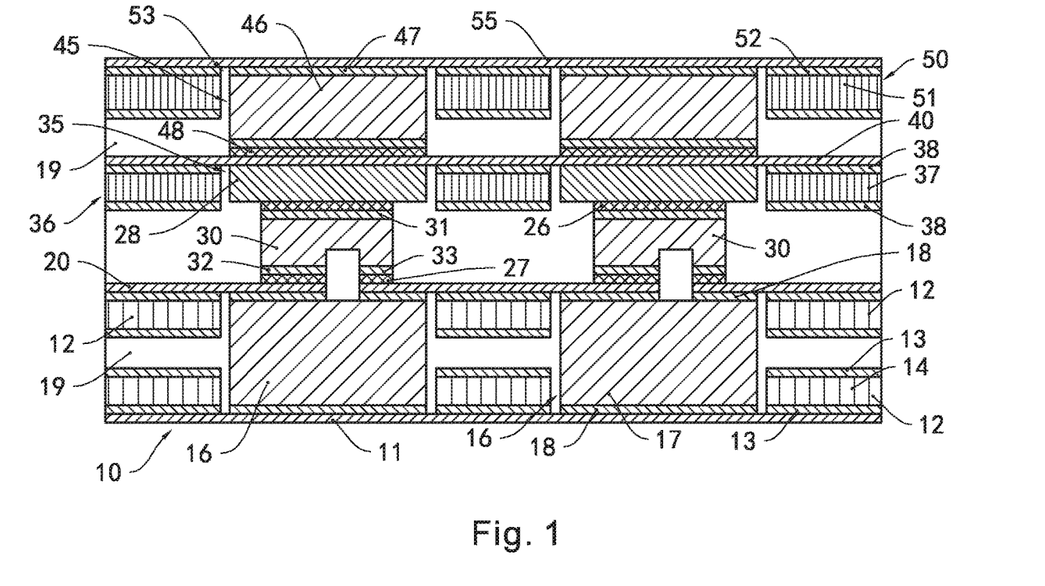
FIG. 1 is a cross-sectional view of an IGBT module according to Embodiment 1 of the present invention.

As shown in FIG. 1, the heat dissipation base plate 10 includes the wiring layer 11 located at the lowermost end, and the traces are formed on the wiring layer 11. Preferably, the wiring layer 11 is formed by etching the copper foil. It should be noted that the directions indicated by terms "up" and "down" in the present invention are referred to the directions shown in FIGS. 1-8, which, however, should not be understood as limitations to the present invention.

Figure 2:
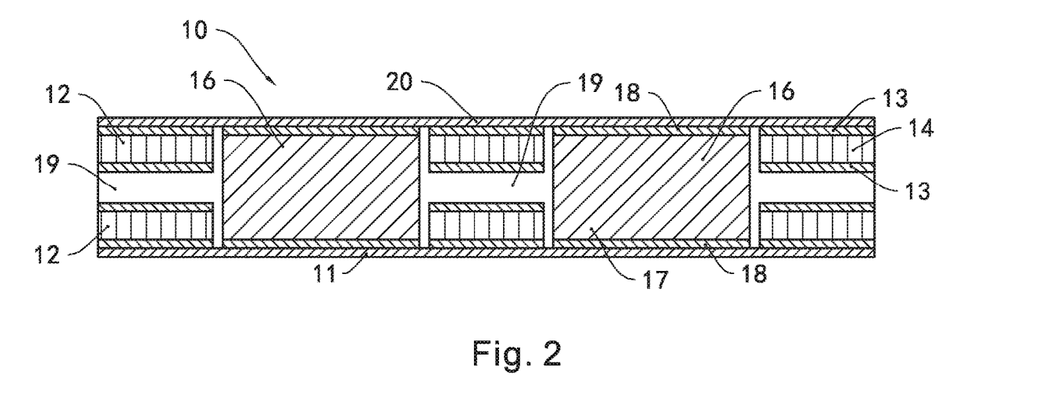
FIG. 2 is a cross-sectional view showing a first state in the manufacturing process of the IGBT module manufacturing method according to Embodiment 1 of the present invention.

As shown in FIG. 2, besides the wiring layer 11, the heat dissipation base plate 10 further includes the plurality of ceramic heat dissipation elements 16 and the two heat dissipation plates 12. Specifically, the two heat dissipation plates 12 are respectively located at the upper and lower sides of the heat dissipation base plate 10. Each heat dissipation plate 12 is provided with a plurality of through holes, and the ceramic heat dissipation elements 16 are located in the through holes of the two heat dissipation plates 12. Moreover, the two heat dissipation plates 12 are non-adjacent, and the organic insulating medium 19 is filled between the two heat dissipation plates 12. Preferably, the organic insulating medium is a polypropylene material. It should be noted that the space without the hatching in FIGS. 1-8 is filled with the organic insulating medium.

Each of the ceramic heat dissipation elements 16 includes one ceramic element 17. Specifically, the ceramic element 17 is an aluminum nitride ceramic element or an aluminum oxide ceramic element. The copper-clad layers 18 are provided on the upper surface and the lower surface of the ceramic element 17. Thus, the ceramic heat dissipation element 16 is a ceramic heat dissipation element with double copper-cladded sides. Alternatively, the metal layer made of other kinds of metal may be formed on the upper surface and the lower surface of the ceramic element 17, for instance the metal layer made of aluminum or the like.

The wiring layer 20 is provided on a side of the heat dissipation base plate 10. In Embodiment 1, the wiring layer 20 is provided on the surface opposite to the wiring layer 11. Preferably, the traces of the wiring layer 20 may be formed by cladding copper and etching the copper. Further, a plurality of bonding pads are formed on the wiring layer 20 so as to facilitate the mounting of the IGBT chip 30 onto the wiring layer 20.

In Embodiment 1, the plurality of IGBT chips 30 are mounted onto the wiring layer 20, and each IGBT chip 30 includes one collector terminal 31, the gate terminal 32 and the emitter terminal 33. In FIG. 1, the collector terminal 31 is located above the IGBT chip 30, and the heat conductive metal plate 28 is provided above the IGBT chip 30. Therefore, the collector terminal 31 is mounted onto the upper side of the heat conductive metal plate 28 through the solder paste 26, and the gate terminal 32 and the emitter terminal 33 are mounted onto the bonding pads of the wiring layer 20 through the solder paste 27. Preferably, the solder paste 26 adhered between the collector terminal 31 and the heat conductive metal plate 30 is the high-temperature solder paste, while the solder paste 27 adhered between the gate terminal 32 and the wiring layer 20, and the solder paste 27 adhered between the emitter terminal 33 and the wiring layer 20 is a low-temperature solder paste. Further, in Embodiment 1, the area of the heat conductive metal plate 28 is larger than the area of the IGBT chip 30. Alternatively, the IGBT chip can be inversely placed in the actual manufacturing, namely, the collector terminal of the IGBT chip is mounted onto the wiring layer 20, and the gate terminal and the emitter terminal are mounted onto the heat conductive metal plate.

The heat dissipation plate 36 is further provided above the wiring layer 20. The heat dissipation plate 36 includes a piece of fiberglass plate 37. The metal layers 38, e.g. copper-cladding layers, are provided on the upper surface and the lower surface of the fiberglass plate 37. Besides, the heat dissipation plate 36 is provided with the plurality of through holes 35, and the cross-sectional area of each through hole is required to be larger than the area of the heat conductive metal plate 28 so that the IGBT chip 30 and the heat conductive metal plate 28 can be fit inside the through hole 35. The organic insulating medium 19, e.g. polypropylene, is filled between the heat dissipation plate 36 and the wiring layer 20. By this way, the IGBT chip 30 will be surrounded by the organic insulating medium 19. Since the organic insulating medium 19 has a high voltage withstanding capability, the IGBT module can withstand up to 40 kV high voltage.

As shown in FIG. 1, the upper surface of the heat dissipation plate 36 is aligned with the upper surface of the heat conductive metal plate 28. The wiring layer 40 is provided above the heat dissipation plate 36 and the heat conductive metal plate 28. The wiring layer 40 is the traces formed by etching a layer of copper foil electroplated on the heat dissipation plate 36 and the heat conductive metal plate 28. Preferably, the thickness of the heat conductive metal plate 28 is relatively large, e.g. the thickness of the heat conductive metal plate 28 may be 0.6 mm. As shown in FIG. 1, the thickness of the heat conductive metal plate 28 is much greater than the thickness of the wiring layer 40.

The plurality of ceramic heat dissipation elements 45 are provided on the wiring layer 40. Each ceramic heat dissipation element 45 is provided with one ceramic element 46. The metal layers 47, e.g. the copper-cladding layers, are provided on the upper surface and the lower surface of the ceramic element 46. The ceramic heat dissipation element 45 is mounted onto the wiring layer 40 through a piece of solder paste 48. Preferably, the solder paste 48 is a piece of high-temperature solder paste. The heat dissipation plate 50 is further provided on a side of the wiring layer 40 away from the IGBT chip 30, i.e. above the wiring layer 40. The heat dissipation plate 50 has the same structure as the heat dissipation plate 36. Namely, the heat dissipation plate 50 also includes the fiberglass plate 51. The metal layers 52, e.g. the copper-cladding layers, are provided on the upper surface and the lower surface of the fiberglass plate 51. The plurality of through holes 53 are provided in the heat dissipation plate 50. The cross-sectional area of each through hole is required to be larger than the area of the ceramic heat dissipation element 45 so that the ceramic heat dissipation element 45 can be put in the through hole 53.

Further, a gap is provided between the heat dissipation plate 50 and the wiring layer 40. The organic insulating medium 19, e.g. polypropylene, is filled between the heat dissipation plate 50 and the wiring layer 40 so that the organic insulating medium 19 is also filled between the plurality of ceramic insulators 45, thereby improving the insulation performance of the IGBT module.

Preferably, the upper surface of the heat dissipation plate 50 is aligned with the upper surface of the ceramic heat dissipation element 45, so it is easy to plate the copper onto the upper surface of the heat dissipation plate 50 and the upper surface of the ceramic heat dissipation element 45 and form the wiring layer 55 by etching. It follows that the IGBT module includes four wiring layers in total including the wiring layer 11, the wiring layer 20, the wiring layer 40, and the wiring layer 50. The wiring layer 20 and the wiring layer 40 can be electrically connected through the IGBT chip 30.

The manufacturing process of the IGBT module will be described hereinafter with reference to FIGS. 2 to 7. First, a heat dissipation base plate is manufactured, and the structure of the heat dissipation base plate is as shown in FIG. 2. While manufacturing the heat dissipation base plate 10, through holes are first provided in the two heat dissipation plates 12, and the prepreg with a through hole is placed between the two heat dissipation plates 12. After that, the ceramic heat dissipation element 16 is placed in the through hole, and the two heat dissipation plates 12 are laminated with the ceramic heat dissipation element 16 at a high temperature, so as to melt the prepreg and form the organic insulating medium 19. The organic insulating medium 19 may be the polypropylene, the silane or the epoxy resin. Finally, the upper surface and the lower surface of the laminated plate 14 are cladded with copper 13, and the copper is etched to form the wiring layer 11 and the wiring layer 20, respectively. Preferably, the wiring layer 20 is provided with a plurality of bonding pads.

Figure 3:
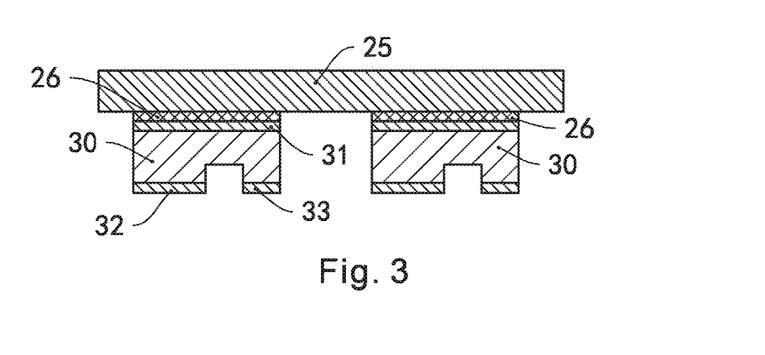
FIG. 3 is a cross-sectional view showing a second state in the manufacturing process of the IGBT module manufacturing method according to Embodiment 1 of the present invention.

While manufacturing the heat dissipation base plate 10, the IGBT chip having the heat conductive metal plate needs to be manufactured. As shown in FIG. 3, the plurality of IGBT chips 30 are mounted onto a piece of heat conductive metal plate 25 by the Surface Mounting Technology (SMT) process. Preferably, the heat conductive metal plate 25 is a copper plate having a large thickness. Preferably, the thickness of the heat conductive metal plate 25 is greater than 0.6 mm.

Figure 4:
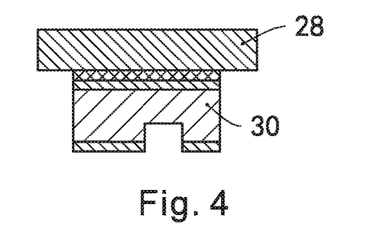
FIG. 4 is a cross-sectional view showing a third state in the manufacturing process of the IGBT module manufacturing method according to Embodiment 1 of the present invention.

After mounting the plurality of IGBT chips 30 onto the heat conductive metal plate 25, the heat conductive metal plate 25 is cut. As shown in FIG. 4, only one IGBT chip 30 is mounted onto each heat conductive metal plate 28 after cutting. Further, the collector terminal 31 of the IGBT chip 30 is mounted onto the heat conductive metal plate 28 through the piece of solder paste 26. Preferably, the area of the heat conductive metal plate 28 mounted onto the IGBT chip 30 is larger than the area of the upper surface of the IGBT chip 30.

Figure 5:
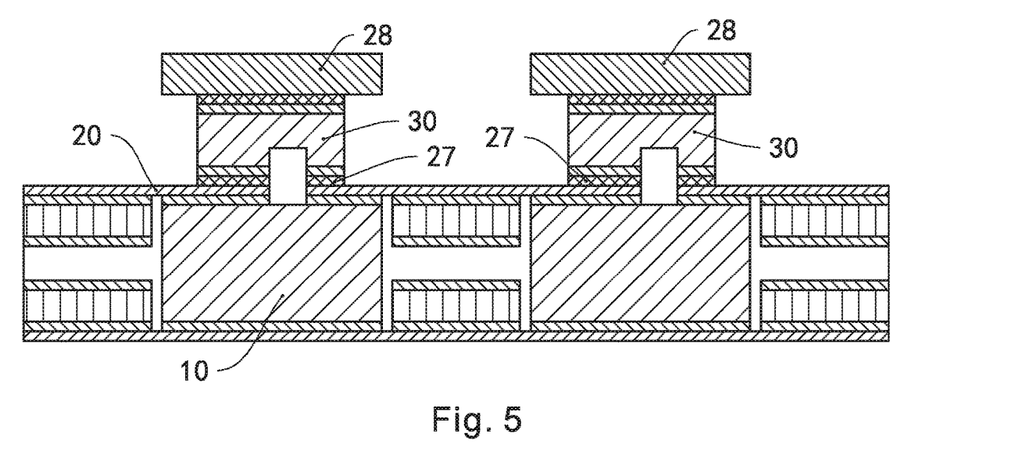
FIG. 5 is a cross-sectional view showing a fourth state in the manufacturing process of the IGBT module manufacturing method according to Embodiment 1 of the present invention.

Subsequently, as shown in FIG. 5, the IGBT chip 30 having the heat conductive metal plate 28 is mounted onto the wiring layer 20 of the heat dissipation plate 10. Preferably, the wiring layer 20 is provided with a plurality of bonding pads. The gate terminal 32 and the emitter terminal 33 of the IGBT chip 30 are mounted onto the bonding pads of the wiring layer 20 through the solder paste 27.

Figure 6:
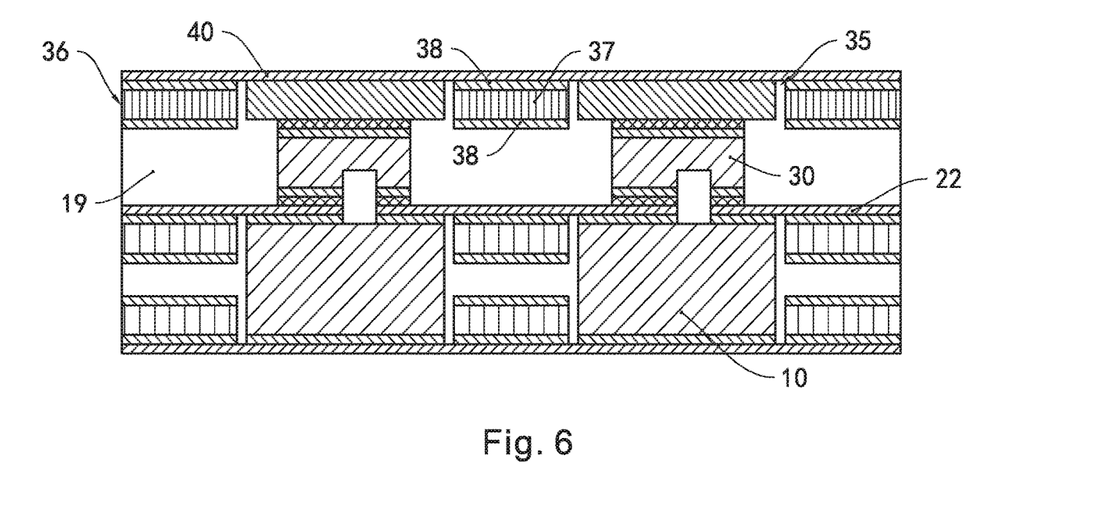
FIG. 6 is a cross-sectional view showing a fifth state in the manufacturing process of the IGBT module manufacturing method according to Embodiment 1 of the present invention.

Next, as shown in FIG. 6, the prepreg with the through hole is placed on the wiring layer 20, and then the heat dissipation plate 36 with the through hole 35 is placed on the prepreg. Moreover, the IGBT chip 30 is located in the through hole, and one IGBT chip 30 matches one through hole. After that, the heat dissipation base plate 10, the prepreg and the heat dissipation plate 36 are laminated at a high temperature to melt the prepreg and form the organic insulating medium 19. Hence, the periphery of the IGBT chip 30 is surrounded by the organic insulating medium 19.

During the high-temperature laminating process, a few amount of organic insulating medium may present on the upper surfaces of the heat dissipation plate 36 and the heat conductive metal plate 28 while melting the prepreg to form the organic insulating medium 19. As a consequence, the upper surfaces of the heat dissipation plate 36 and the heat conductive metal plate 28 should be polished to remove the organic insulating medium 19 present on the upper surfaces of the heat dissipation plate 36 and the heat conductive metal plate 28. By doing so, the upper surfaces of the heat dissipation plate 36 and the heat conductive metal plate 28 are smoothened. Then, a layer of copper foil is electroplated on the upper surfaces of the heat dissipation plate 36 and the heat conductive metal plate 28, and the copper foil is etched to form the wiring layer 40, thereby forming an intermediate product.

Figure 7:
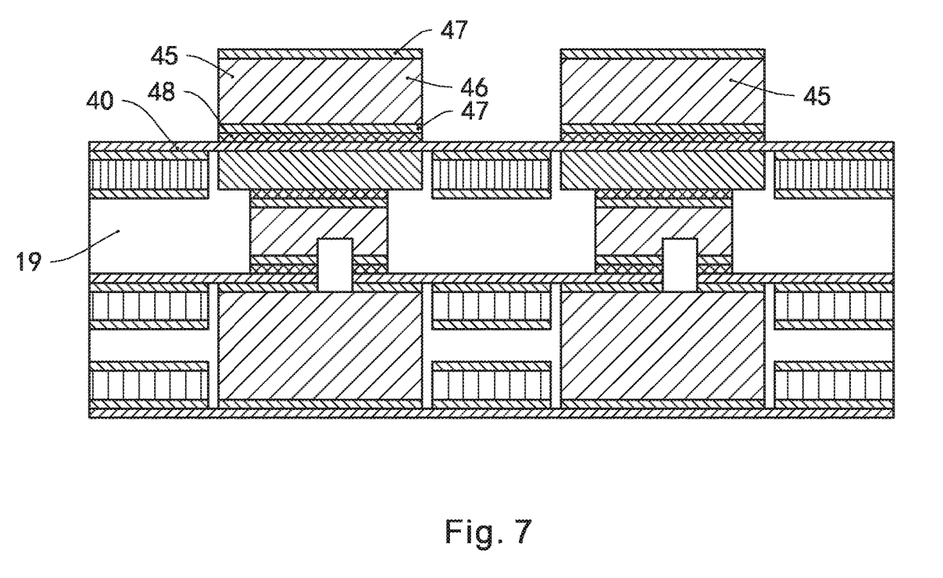
FIG. 7 is a cross-sectional view showing a sixth state in the manufacturing process of the IGBT module manufacturing method according to Embodiment 1 of the present invention.

Subsequently, the plurality of ceramic heat dissipation elements 45 are mounted onto the intermediate product, i.e. the ceramic heat dissipation elements 45 are mounted onto the wiring layer 40. As shown in FIG. 7, each ceramic heat dissipation element 45 is mounted onto the wiring layer 40 through the solder paste 48. After that, the prepreg with the through hole is placed on the wiring layer 40, and then the heat dissipation plate 50 with the through hole 53 is placed on the prepreg so that the ceramic heat dissipation element 45 is located in the through hole. The intermediate product, the prepreg, and the heat dissipation plate 50 are laminated at a high temperature to melt the prepreg and form the organic insulating medium 19.

Finally, the upper surfaces of the heat dissipation plate 50 and the ceramic heat dissipation element 45 are polished to remove the organic insulating medium 19 left on the upper surfaces of the heat dissipation plate 50 and the ceramic heat dissipation element 45, so the upper surfaces of the heat dissipation plate 50 and the ceramic heat dissipation element 45 are smoothened. Then, the copper foil is electroplated on the upper surfaces of the heat dissipation plate 50 and the ceramic heat dissipation element 45, and the copper foil is etched to form the wiring layer 55, thereby completing the manufacture of the IGBT module.

The collector terminal 31 of the IGBT chip 30 is connected to the wiring layer 40 through the heat conductive metal plate 28, and the gate terminal 32 and the emitter terminal 33 are mounted onto the wiring layer 20 so that the IGBT chip 30 is connected to the wiring layer without the assistance of the metal wire in the packaging. For example, the collector terminal 31 can be electrically connected to wiring layer 40 through the heat conductive metal plate 28. Owing to the high current carrying capability of the heat conductive metal plate 28, which is much greater than the current carrying capability of the metal wire, the current carrying capability of the IGBT module is greatly improved according to Embodiment 1. Moreover, the IGBT module of Embodiment 1 has simpler manufacturing process and lower manufacturing cost over the IGBT module requiring the metal wires welded on the IGBT chip 30.

In addition, since the periphery of the IGBT chip 30 is surrounded by the organic insulating medium 19, and the organic insulating medium 19 can withstand a higher voltage, the IGBT module can withstand up to 40 kV high voltage. The heat dissipation base plate 10 and the heat dissipation plate 36 are respectively provided on the upper end and the lower end of the IGBT chip 30, and the ceramic heat dissipation element 16 is provided in the heat dissipation base plate 10, and the ceramic heat dissipation element 46 is provided above the heat dissipation plate 36 so that the heat generated by the IGBT chip 30 is quickly dissipated, and the heat dissipation performance of the IGBT module is improved.

In the above-mentioned embodiment, only the IGBT chip is embedded in the IGBT module. In practical applications, the IC chip may also be embedded in the IGBT module.

Embodiment 2

Figure 8:
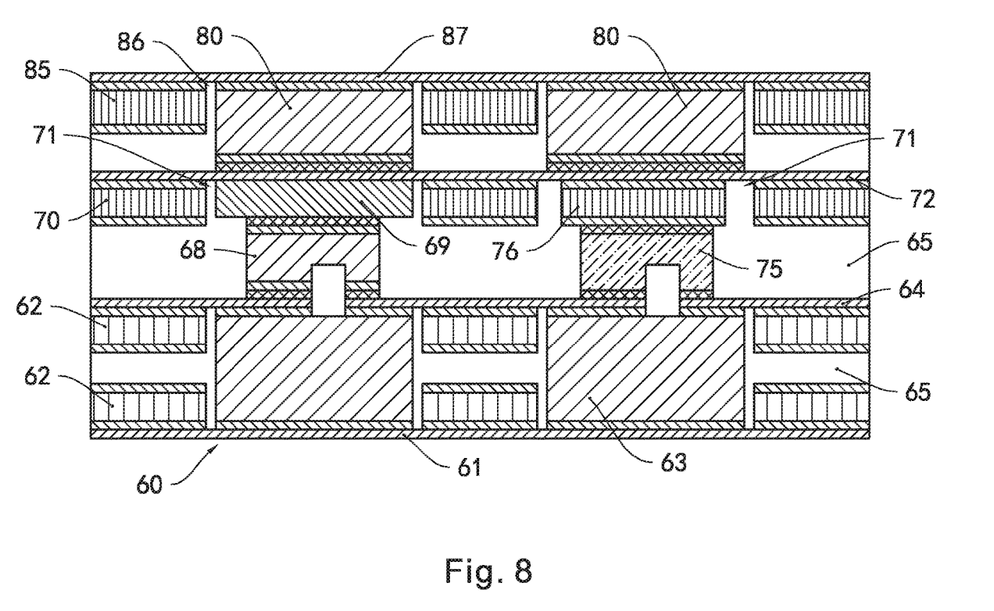
FIG. 8 is a cross-sectional view of an IGBT module according to Embodiment 2 of the present invention.

Referring to FIG. 8, the IGBT module of Embodiment 2 includes the heat dissipation base plate 60. The heat dissipation base plate 60 includes the two heat dissipation plates 62. Each of the two heat dissipation plates 62 is provided with a through hole, and the ceramic heat dissipation element 63 is located in the through hole. The organic insulating medium 65 is filled between the two heat dissipation plates 62. Further, the wiring layer 61 is formed on the lower surface of the heat dissipation base plate 60, and the wiring layer 64 is formed on the upper surface of the heat dissipation base plate 60. Preferably, a plurality of bonding pads are provided on the wiring layer 64.

At least one IGBT chip 68 and at least one IC chip 75 are mounted onto the wiring layer 64. Preferably, the gate terminal and the emitter terminal of the IGBT chip 68 are mounted onto the bonding pads of the wiring layer 64 through solder paste, and the collector terminal of the IGBT chip 68 is mounted onto a piece of heat conductive metal plate 69 by solder paste. As a result, in FIG. 8, the heat conductive metal plate 69 is located above the IGBT chip 68.

Some of the pins of the IC chip 75 are mounted onto the bonding pads of the wiring layer 40 by solder paste, and the rest of pins of the IC chip 75 are mounted onto one heat dissipation sheet 76. Preferably, the heat dissipation sheet 76 may be an FR-4 sheet, including the fiberglass plate and the metal layers located on the upper surface and the lower surface of the fiberglass plate, and the IC chip 75 is mounted onto the heat dissipation sheet 76 by a piece of solder paste.

The heat dissipation plate 70 is provided above the wiring layer 64, and the plurality of through holes 71 are provided in the heat dissipation plate 70. One IGBT chip 68 or one IC chip 75 fits one through hole 71. Namely, no situation of having both the IGBT chip 68 and the IC chip 75 in one through hole will occur. Further, the organic insulating medium 65, such as polypropylene, epoxy resin, or silane, is filled between the heat dissipation plate 70 and the wiring layer 64. By doing so, the peripheries of the IGBT chip 68 and the IC chip 75 are surrounded by the organic insulating medium 65, thereby improving the voltage withstand performance of the IGBT module.

Further, the upper surfaces of the heat dissipation plate 70, the heat conductive metal plate 69, and the heat dissipation sheet 76 are smooth. The copper foil is electroplated on the upper surfaces of the heat dissipation plate 70, the heat conductive metal plate 69, and the heat dissipation sheet 76, and the copper foil is etched to form the wiring layer 72.

The plurality of ceramic heat dissipation elements 80 are mounted onto the wiring layer 72. The heat dissipation plate 85 with the through hole 86 is provided above the wiring layer 72. The middle layer of the heat dissipation plate 85 is the fiberglass plate. The metal layers are provided on the upper surface and the lower surface of the fiberglass plate. The ceramic heat dissipation element 80 is located in the through hole 86. The organic insulating medium 65 is filled between the heat dissipation plate 85 and the wiring layer 72 so that the periphery of the plurality of heat dissipation elements 80 is surrounded by the organic insulating medium 65. Moreover, the upper surfaces of the heat dissipation plate 85 and the ceramic heat dissipation element 80 are smooth and electroplated with the copper foil. The copper foil is etched to form the wiring layer 87.

In order to enable the IGBT module to carry large current, a thicker copper foil of the wiring layer 72 is required so as to prevent burn out of the wiring layer 72 even when a large current passes through the wiring layer 72. Obviously, the thickness of the heat conductive metal plate 69 should be greater than the thickness of the wiring layer 72.

The method for manufacturing the IGBT module according to Embodiment 2 is basically the same as the method for manufacturing the IGBT module according to Embodiment 1. The difference is in that when the IGBT chip 68 is mounted onto the wiring layer 64, the IC chip 75 is also mounted onto the wiring layer 64. Apparently, the IC chip 75 having the heat dissipation sheet 76 is pre-manufactured. While manufacturing the IC chip 75 having the heat dissipation sheet 76, the plurality of IC chips 75 are mounted onto a large heat dissipation sheet. After that, the large heat dissipation sheet with the plurality of IC chips 75 is cut, so that each heat dissipation sheet 76 after cutting is mounted with one IC chip 75.

The IGBT module of Embodiment 2 also has the advantages of the high voltage withstanding capability and the large current carrying capability. The IGBT chip and the IC chip are packaged and connected to the circuit without the assist of the metal wire, which simplifies the manufacturing process, and reduces the production cost of the IGBT module.

Obviously, the above-mentioned embodiments are merely preferred embodiments of the present invention. A large number of modifications can be applied in practice. For example, the metal layers on the two surfaces of the wiring layer and the ceramic heat dissipation element are not necessarily made of copper, aluminum or other metal materials are also acceptable. Or, the thickness of the electroplated copper foil for creating the wiring layer may be designed according to actual demands. Such modifications will not affect the implementation of the present invention.

Finally, it should be emphasized that the present invention is not limited to the above-mentioned embodiments. The modifications, such as changing the specific material of the ceramic heat dissipation element and the organic insulating medium, etc., are also covered by the protection scope of the present invention.

INDUSTRIAL APPLICABILITY

The IGBT module of the present invention can be applied to manufacture various circuit boards of the electronic devices such as LED lamps, especially the high-frequency LED lamps, where the IGBT chip of the IGBT module is used as a soft-switching device. Another example is that the IGBT module can be applied to the circuit board of the motor controller. Since multiple wiring layers can be formed in the IGBT module, a large variety of traces can be formed on the wiring layers according to actual usage requirements, and various related electronic devices can be mounted or soldered on the wiring layers to form different printed circuit boards. Anyway, the application range of the IGBT module is very extensive.

What is claimed is:

1. An IGBT module, comprising:
a heat dissipation base plate having a top surface and a bottom surface, wherein a first ceramic heat dissipation element is embedded in the heat dissipation base plate between the top and bottom surfaces; a first wiring layer is provided on the top surface of the heat dissipation base plate; a first side of an IGBT chip is mounted onto the first wiring layer and over the top surface of the heat dissipation base plate;
wherein
a heat conductive metal plate is positioned on a second side of the IGBT chip; a first heat dissipation plate having a first through hole and the first heat dissipation plate is provided on a side of the first wiring layer; the heat conductive metal plate is located in the first through hole; a second wiring layer is positioned on the heat conductive metal plate and on a side of the first heat dissipation plate away from the IGBT chip; a second side of the IGBT chip is electrically connected to the second wiring layer through the heat conductive metal plate;
a second heat dissipation plate having a second through hole and the second wiring layer is provided on a side of the second heat dissipation plate, which is away from the IGBT chip;
a second ceramic heat dissipation element is positioned in the second through hole, a third wiring layer is provided on the second heat dissipation plate; and
an organic insulating medium is filled between the first heat dissipation plate and the heat dissipation base plate, and between the first heat dissipation plate and the second heat dissipation plate.

2. The IGBT module according to claim 1, wherein
an IC chip having a heat dissipation sheet is further provided on and at the side of the first wiring layer, and the heat dissipation sheet is located in the first through hole.

3. The IGBT module according to claim 2, wherein
the heat conductive metal plate is provided on a collector terminal of the IGBT chip, and a gate terminal and an emitter terminal of the IGBT chip are mounted onto the first wiring layer.

4. The IGBT module according to claim 2, wherein
the first heat dissipation plate and/or the second heat dissipation plate each comprises a fiberglass plate, and first metal layers are provided on two sides of the fiberglass plate.

5. The IGBT module according to claim 1, wherein
the heat conductive metal plate is provided on a collector terminal of the IGBT chip, and a gate terminal and an emitter terminal of the IGBT chip are mounted onto the first wiring layer.

6. The IGBT module according to claim 5, wherein
the first heat dissipation plate and/or the second heat dissipation plate each comprises a fiberglass plate, and first metal layers are provided on two sides of the fiberglass plate.

7. The IGBT module according to claim 1, wherein
the first heat dissipation plate and/or the second heat dissipation plate each comprises a fiberglass plate, and first metal layers are provided on two sides of the fiberglass plate.

8. The IGBT module according to claim 7, wherein
the heat conductive metal plate is provided on a collector terminal of the IGBT chip, and a gate terminal and an emitter terminal of the IGBT chip are mounted onto the first wiring layer.

9. The IGBT module according to claim 1, wherein
the first ceramic heat dissipation element and/or the second ceramic heat dissipation element each comprises a ceramic element, and second metal layers are provided on two sides of the ceramic element.

10. The IGBT module according to claim 1, wherein
a thickness of the heat conductive metal plate is greater than a thickness of the second wiring layer.

11. The IGBT module according to claim 1, wherein
the organic insulating medium is selected from the group consisting of polypropylene, epoxy resin and silane.

12. A method for manufacturing an IGBT module, comprising:
manufacturing a heat dissipation base plate having a top surface and a bottom surface, embedding a first ceramic heat dissipation element in the heat dissipation base plate between the top and bottom surfaces, and forming a first wiring layer on the top surface of the heat dissipation base plate;
mounting a first side of an IGBT chip onto a heat conductive metal plate, and mounting a second side of the IGBT chip onto the first wiring layer, wherein two opposite surfaces of the IGBT chip are respectively mounted onto the heat conductive metal plate and the first wiring layer;
providing a first through hole in a first heat dissipation plate and positioning a first prepreg on the first wiring layer and providing the heat conductive metal plate in the first through hole; laminating the first heat dissipation plate and the first prepreg with the heat dissipation base plate; electroplating a first metal layer onto the first heat dissipation plate and the heat conductive metal plate; and etching the first metal layer to form a second wiring layer, thereby forming an intermediate product;
mounting a second ceramic heat dissipation element onto the second wiring layer,
providing a second through hole in a second heat dissipation plate;
positioning a second prepreg and the second heat dissipating plate on the second wiring layer, and providing the second ceramic heat dissipation element in the second through hole; laminating the intermediate product and the second prepreg with the second ceramic heat dissipation element, and electroplating a second metal layer onto the second heat dissipation plate and the second ceramic heat dissipation element; and etching the second metal layer to form a third wiring layer.

13. The method for manufacturing an IGBT module according to claim 12, further comprising:
mounting an IC chip on a heat dissipation sheet before placing the first prepreg on the first wiring layer.

14. The method for manufacturing an IGBT module according to claim 12, wherein
the step of mounting the IGBT chip onto the heat conductive metal plate comprises: mounting two or more IGBT chips on a piece of heat conductive metal plate, and cutting the heat conductive metal plate to obtain cut heat conductive metal plates each have one IGBT module.

15. The method for manufacturing an IGBT module according to claim 12, wherein
- a collector terminal of the IGBT chip is mounted onto the heat conductive metal plate when the IGBT chip is mounted onto the heat conductive metal plate; and
- a gate terminal and an emitter terminal of the IGBT chip are mounted onto the first wiring layer when the IGBT chip is mounted onto the first wiring layer.

16. The method for manufacturing an IGBT module according to claim 12, further comprising:
- polishing a laminated plate after laminating the first heat dissipation plate and the first prepreg with the heat dissipation base plate; and electroplating a first metal layer onto the first heat dissipation plate and the heat conductive metal plate.

17. The method for manufacturing an IGBT module according to claim 12, further comprising:
- polishing a laminated plate after laminating an intermediate product and the second prepreg with the second ceramic heat dissipation element, and electroplating a second metal layer onto the second heat dissipation plate and the second ceramic heat dissipation element.

18. The method for manufacturing an IGBT module according to claim 12, wherein
- a thickness of the heat conductive metal plate is greater than a thickness of the second wiring layer.

\* \* \* \* \*